US007826178B2

(12) United States Patent  (10) Patent No.: US 7,826,178 B2
Honda  (45) Date of Patent: Nov. 2, 2010

(54) MICROACTUATOR, HEAD GIMBAL ASSEMBLY AND HARD DISK DRIVE USING THE SAME, AND MANUFACTURING METHOD THEREOF

(75) Inventor: Takashi Honda, Hong Kong (HK)

(73) Assignee: SAE Magnetics (H.K) Ltd., Hong Kong (HK)

( * ) Notice: Subject to any disclaimer, the term of this patent is extended or adjusted under 35 U.S.C. 154(b) by 1067 days.

(21) Appl. No.: 11/461,480

(22) Filed: Aug. 1, 2006

(65) Prior Publication Data

US 2007/0030601 A1 Feb. 8, 2007

(30) Foreign Application Priority Data

Aug. 2, 2005 (JP) .............................. 2005-223567

(51) Int. Cl.
*G11B 5/56* (2006.01)
(52) U.S. Cl. .................................. 360/294.4
(58) Field of Classification Search ............. 360/294.4, 360/294.3, 294.7, 294.1, 244.2, 244.8
See application file for complete search history.

(56) References Cited

U.S. PATENT DOCUMENTS 7,038,888 B2* 5/2006 Ma ......................... 360/294.4
2003/0223154 A1* 12/2003 Yao ......................... 360/265.7
2004/0021989 A1* 2/2004 Ma ......................... 360/294.4
2005/0117262 A1 6/2005 Yao et al.

FOREIGN PATENT DOCUMENTS

JP 2001-118230 4/2001

OTHER PUBLICATIONS

English Language Abstract of JP 2001-118230, Publication date Apr. 27, 2001.
U.S. Appl. No. 11/426,091, to Honda, filed Jun. 23, 2006.

* cited by examiner

*Primary Examiner*—Allen T Cao
(74) *Attorney, Agent, or Firm*—Greenblum & Bernstein P.L.C.

(57) ABSTRACT

A microactuator includes: a stage on which a positioning object is to be mounted; a frame to which the stage is fixed integrally; a piezoelectric device disposed on the frame, which deforms in an expanding or contracting manner based on a driving signal applied; and a drive which applies a driving signal to the piezoelectric device. The piezoelectric device is arranged to expand or contract to thereby apply a torque to the frame.

13 Claims, 9 Drawing Sheets

MICROACTUATOR, HEAD GIMBAL ASSEMBLY AND HARD DISK DRIVE USING THE SAME, AND MANUFACTURING METHOD THEREOF

BACKGROUND OF THE INVENTION

1. Field of the Invention

The present invention relates to a microactuator, and in particular, to a microactuator for rotational driving. Further, the present invention relates to a head gimbal assembly and a hard disk drive on which such a microactuator is mounted, and moreover, to a method of manufacturing a microactuator or a head gimbal assembly.

2. Related Art

A hard disk drive, which is a data storage, is provided with a head gimbal assembly on which a magnetic head slider for reading or writing data from/into a magnetic disk, or a storage medium, is mounted. The head gimbal assembly includes: a magnetic head slider; a flexure having a spring property on which the magnetic head slider is mounted on the tip part thereof; an FPC (flexible printed circuit) formed on the flexure, for transmitting signals to the magnetic head slider; and a load beam supporting the flexure. The load beam is mounted on a head arm via a base plate. Further, a plurality of head gimbal assemblies are stacked and fixed to a carriage via respective head arms and pivotally supported so as to be driven rotationally by a voice coil motor to thereby constitute a head stack assembly.

The head gimbal assembly is driven rotationally by the voice coil motor to thereby position the magnetic head slider mounted on the tip part thereof. In recent years, however, due to an increase in recording density of a magnetic disk, positioning accuracy of a magnetic disk with a control by a voice coil motor is not sufficient. Therefore, techniques for mounting a magnetic head slider on a flexure via a microactuator capable of precise driving are disclosed. An example thereof is disclosed in Japanese Patent Laid-Open Publication No. 2001-118230 (Patent Document 1).

A microactuator shown in Patent Document 1 is for swing-driving the tip part of a magnetic head slider on which a read/write element is formed. More specifically, the microactuator includes a fixed part to a tongue plane and a movable part which holds the magnetic head slider and moves, which are arranged in almost parallel, and is configured such that the parts near the centers of the fixed part and the movable part are connected with two connecting members which expand or contract with a voltage applied. By expanding or contracting the two connecting members respectively, the movable part can be swing-driven relative to the fixed part. Thereby, precise positioning control of the read/write element located on the tip part of the magnetic head slider can be realized.

Further, in Patent Document 1, a reinforcement member is further provided since the strength of a piezoelectric member such as PZT, or a connecting element, is weak.

[Patent Document 1] JP2001-118230A

However, for the microactuator of the conventional example, an actuator of the above-mentioned shape must be formed by processing the piezoelectric device, causing a problem that the manufacturing process becomes complex. Further, due to the complexity of the structure in which a reinforcement member is provided to secure the strength of the actuator itself, problems such as complexity of the manufacturing process and an increase in the manufacturing cost are caused.

Further, since swing-driving is caused by expanding or contracting the two connecting members arranged nearby, the swinging range is determined depending on the difference in expansion/contraction thereof. Thereby, a problem of the driving range being narrowed is also caused.

It is therefore an object of the present invention to provide a microactuator, capable of solving disadvantages involved in the above-described conventional example, and in particular, improving the strength, enlarging the driving range, simplifying the manufacturing process and reducing the manufacturing cost.

In order to achieve the object, a microactuator, which is one mode of the present invention, comprises: a stage on which a positioning object is to be mounted; a frame to which the stage is fixed integrally; a piezoelectric device disposed on the frame, which deforms in an expanding or contracting manner based on a driving signal applied; and a drive which applies a driving signal to the piezoelectric device. The piezoelectric device is arranged so as to expand or contract to thereby apply a torque to the frame.

In this case, the piezoelectric device is arranged such that at least a part of the frame is pulled or pushed with reference to the rotational center or the vicinity thereof.

Further, the piezoelectric device is arranged to be expandable/contractible while connecting a part of the frame excluding a part on a member running through the rotational center of the frame and on a connecting part of the member and a member connected thereto, and the rotational center or the vicinity thereof.

According to the invention described above, a piezoelectric device connecting a part of the frame and the rotational center or the vicinity thereof is made to expand or contract by applying a driving signal by a drive, whereby a part of the frame is pulled or pushed with reference to the rotational center or the vicinity thereof. As a result, a torque about the rotational center is caused in the frame itself. Thereby, the stage fixed integrally to the frame is urged to rotate, so the positioning object mounted thereon can be driven rotationally and positioned precisely. Accordingly, the strength of the microactuator itself can be improved with the frame which is a member other than the piezoelectric device, and wide positioning control can be realized since the rotational driving is possible.

Further, the frame is formed of a shaft frame running through the rotational center and one or two end frames provided on one end or both ends almost orthogonal to the shaft frame, and the piezoelectric device is arranged so as to expand or contract while connecting the end frame and the shaft frame. In this case, a connecting area of the piezoelectric device protruding from the shaft frame is formed in the vicinity of the rotational center of the shaft frame. With this configuration, the end frame is pulled or pushed with respect to the vicinity of the rotational center of the shaft frame due to expansion or contraction of the piezoelectric device, so it is possible to cause a torque in the frame itself efficiently.

Further, the piezoelectric devices are provided on both sides of one end frame over a connecting part with the shaft frame such that the respective piezoelectric devices expand and contract opposite each other. In this case, if the end frames are provided on the both ends of the shaft frame, the piezoelectric devices provided on the same side with the shaft frame being the boundary are arranged so as to expand and contract opposite each other, respectively. By causing all piezoelectric devices to expand and contract, it is possible to cause a torque in the same direction about the rotational center. Accordingly, the positioning object can be driven rotationally, efficiently.

Further, a shaft supporting the stage penetrates the rotational center of the frame and is fixed to the frame, and an end of the penetrating shaft serves as a load receiver of the microactuator. Thereby, rotational driving can be realized about the shaft of the stage so as to make the rotational operation smooth.

Further, a head gimbal assembly, which is another mode of the present invention, is characterized in that the microactuator in which a magnetic head slider is mounted on the stage as a positioning object is provided on the tip part of a flexure. In this case, the microactuator is provided such that the rotational center of the frame is pivotally supported by a dimple protruding toward a magnetic disk side formed on a load beam holding the flexure. Particularly, an end part of the shaft of the stage penetrating the frame is desirably supported pivotally by the dimple. Further, a hard disk drive including the head gimbal assembly is configured.

As described above, by using the microactuator as a positioning object of the magnetic head slider in a hard disk drive, it is possible to rotate the read/write element formed on the magnetic head slider, that is, to swing-drive the read/write element in a side range to thereby perform positioning control with high accuracy. Accordingly, it is possible to improve the accuracy of reading/writing of data, and to reduce the size of a hard disk drive and to increase the capacity.

Further, a method of manufacturing a microactuator, which is another mode of the present invention, comprises the steps of: forming a thin film PZT on a silicon substrate; shaping the silicon substrate into a frame; shaping the PZT to have a shape capable of applying a torque to the frame by expansion or contraction of the PZT; and fixing a stage on which a positioning object is to be mounted to the frame integrally.

In the step of fixing the stage to the frame, the stage is fixed such that the shaft supporting the stage penetrates the rotational center of the frame. In the step of shaping the PZT, shaping is performed by etching.

Further, a method of manufacturing a head gimbal assembly including the step of mounting a microactuator manufactured by the manufacturing method mentioned above on the tip part of a flexure is characterized in that in the step of mounting the microactuator on the flexure, the microactuator is mounted such that an end part of the shaft of the stage penetrating the frame is pivotally supported by a dimple protruding toward a magnetic disk side formed on a load beam holding the flexure.

With this configuration, it is possible to use a thin film PZT formed on a silicon substrate as a frame together with the silicon substrate, and to use the PZT formed thereon. Therefore, an additional step of mounting a PZT on the frame is not necessary, so the manufacturing process can be simplified, leading to a reduction in manufacturing cost. Further, since the frame and the PZT are shaped by etching, it is possible to prevent mechanical stress from being involved and to shape those having complex shape.

[Effects of the Invention]

The present invention is configured and works as described above. Therefore, it is possible to improve the strength of the microactuator itself and to rotationally drive the microactuator, whereby it is possible to realize positioning control in a wide range of a positioning object such as a magnetic head slider. Further, since a PZT formed on a silicon substrate is used as a whole together with the silicon substrate to shape an actuator, the present invention exhibits excellent effects such as simplification of the manufacturing process and reduction of the manufacturing cost, which have not been achieved conventionally.

BRIEF DESCRIPTION OF THE DRAWINGS

FIGS. 3A and 3B are diagrams showing the configuration of the body of the microactuator, in which FIG. 3A is a top view and FIG. 3B is a side view;

FIGS. 4A and 4B are diagrams showing the configuration of a stage, in which FIG. 4A is a top view and FIG. 4B is a side view;

DESCRIPTION OF THE PREFERRED EMBODIMENTS

A microactuator, which is the present invention, is characterized in that a torque is applied by a piezoelectric device to a frame on which a positioning object is mounted to thereby drive the positioning object rotationally. Further, the present invention is also characterized in a manufacturing method in which the frame is formed of a silicon substrate, and a PZT formed on the silicon substrate is used as a piezoelectric device.

In an embodiment described below, a case in which a positioning object is a magnetic head slider, and a microactuator which is the present invention is to be mounted on a head gimbal assembly and used in a hard disk drive will be explained as an example. In this example, precise positioning control of a read/write element of the magnetic head slider will be performed. However, the microactuator, which is the present invention, is not limited to perform positioning control of the magnetic head slider. It may be used for positioning another positioning object mounted thereon.

Embodiment 1

Figure 1:
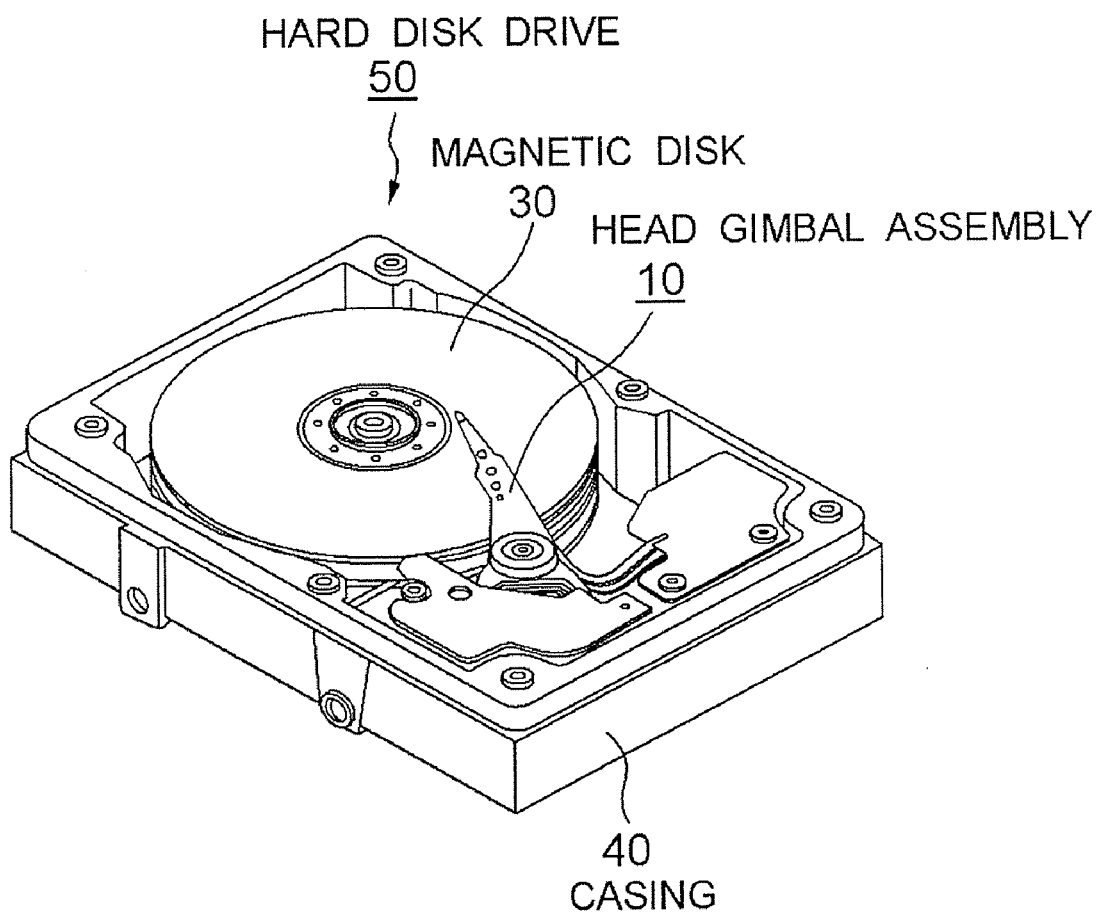
FIG. 1 is a perspective view showing an example of a hard disk drive in which a microactuator is mounted.
Figure 2:
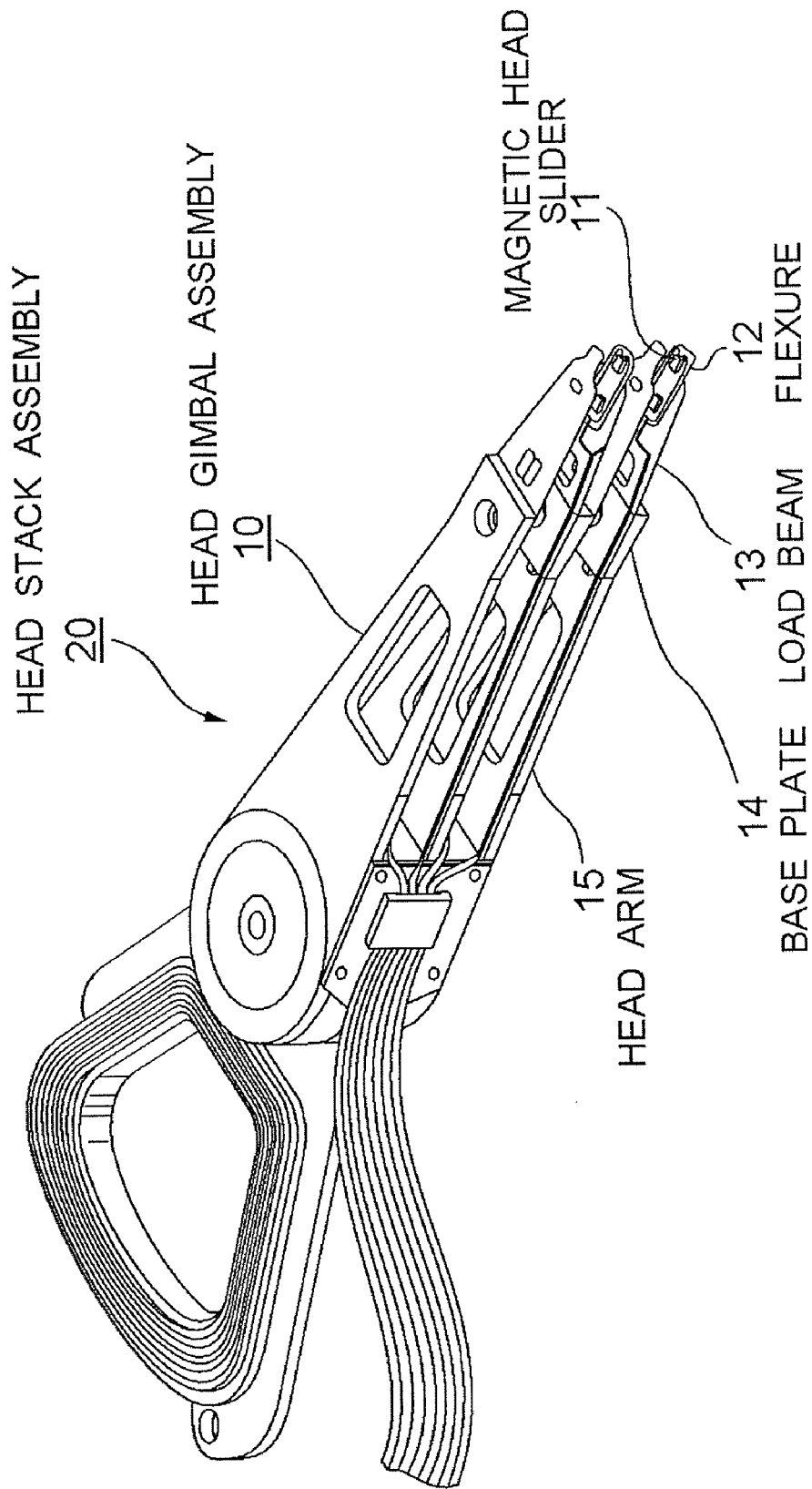
FIG. 2 is a perspective view showing an example of a head stack assembly in which the microactuator is mounted.

A first embodiment of the present invention will be described with reference to FIGS. 1 to 9D. FIG. 1 shows a hard disk drive in which a microactuator, which is the present invention, is mounted. FIG. 2 shows a head gimbal assembly. FIGS. 3 to 7 show the configuration and operation of the microactuator. FIGS. 8A to 9D show a method of manufacturing the microactuator.

[Configuration]

A hard disk drive 50 shown in FIG. 1 includes, in a casing 40, head gimbal assemblies 10 on each of which a magnetic head slider 1 for reading or writing data from/into a magnetic disk 30, which is a storage media, is mounted. Note that a plurality of magnetic disks 30 are provided therein, and a plurality of head gimbal assemblies 10 are stacked on the carriage correspondingly to thereby constitute a head stack assembly 20.

The head stack assembly 20 is pivotally supported by a voice coil motor so as to be driven rotationally. Positioning control of the magnetic head slider 11 mounted on the tip part of each head gimbal assembly 10 is performed by being driven rotationally by the voice coil motor. Further, in the present invention, each head gimbal assembly 10 has a microactuator 1 (hereinafter referred to as an actuator) for a magnetic head, which holds the magnetic head slider 11 to thereby perform precise positioning control of the read/write element of the magnetic head slider 1. Hereinafter, the head gimbal assembly 10 and the actuator 1 will be explained in detail, particularly. Note that in FIG. 2, the configuration of the head gimbal assembly 10 is schematically shown.

As shown in FIG. 2, the head gimbal assembly 10 includes: the magnetic head slider 11; a flexure 12 having a spring property in which the magnetic head slider 11 is mounted on the tip part thereof; an FPC 3 (flexible printed circuit) which is formed on the flexure 12 and transmits signals to the magnetic head slider 11; and a load beam 13 supporting the flexure 12. The load beam 13 is to be mounted on a head arm 15 via a base plate 14.

Since the magnetic head slider 11 is mounted on the flexure 12 via the actuator 1 performing precise positioning as described above, the flexure 12 has a configuration capable of mounting the actuator 1 and not disturbing the driving.

Figure 3A:
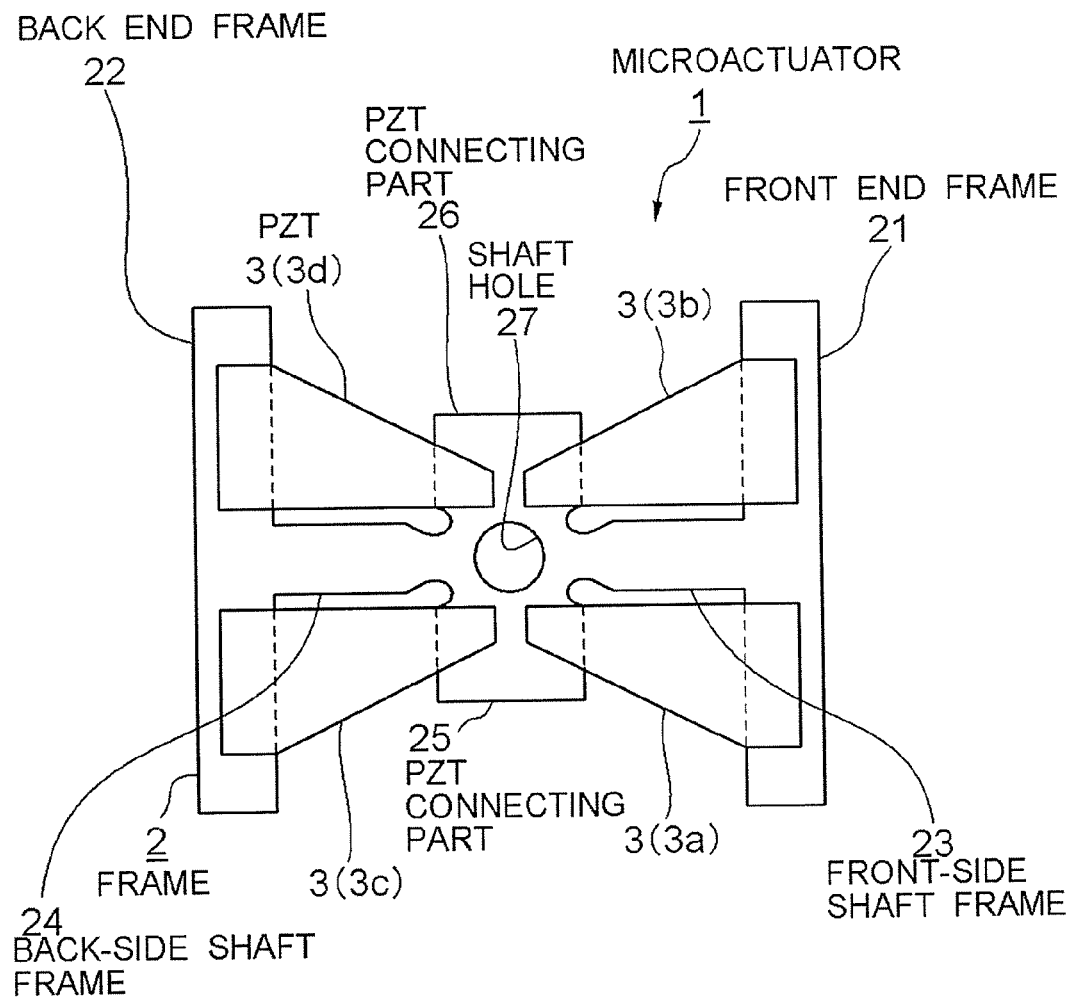
Figure 3B:
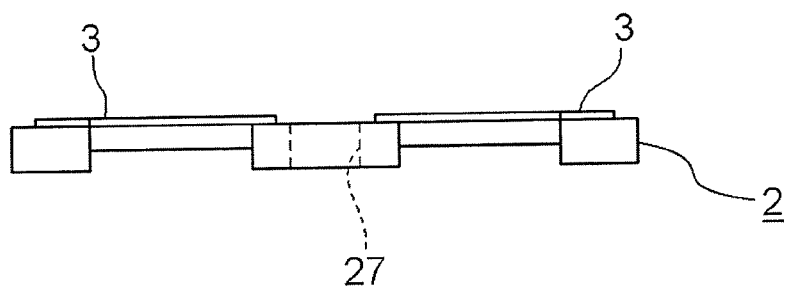
Figure 4A:
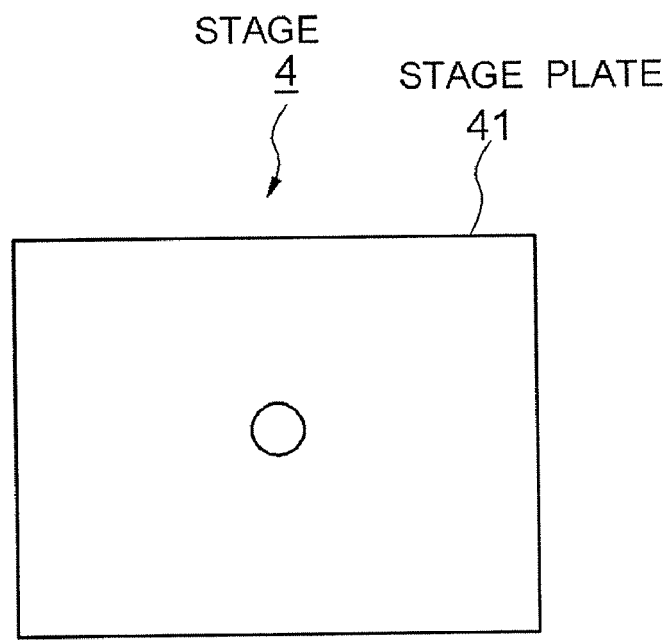
Figure 4B:
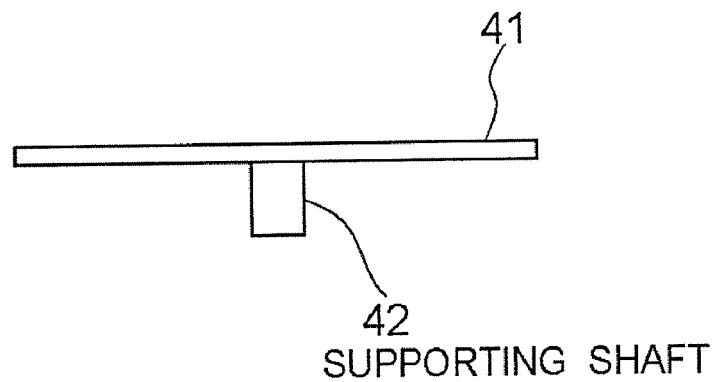
Figure 5:
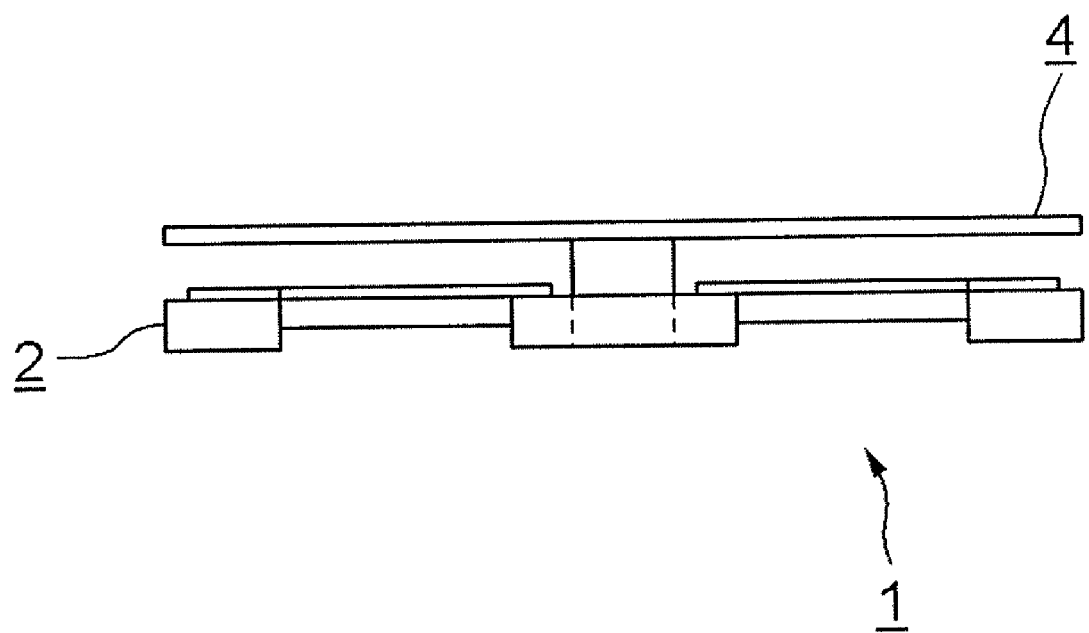
FIG. 5 is a side view showing the configuration of the microactuator in which the stage is mounted on the body of the microactuator.
Figure 6:
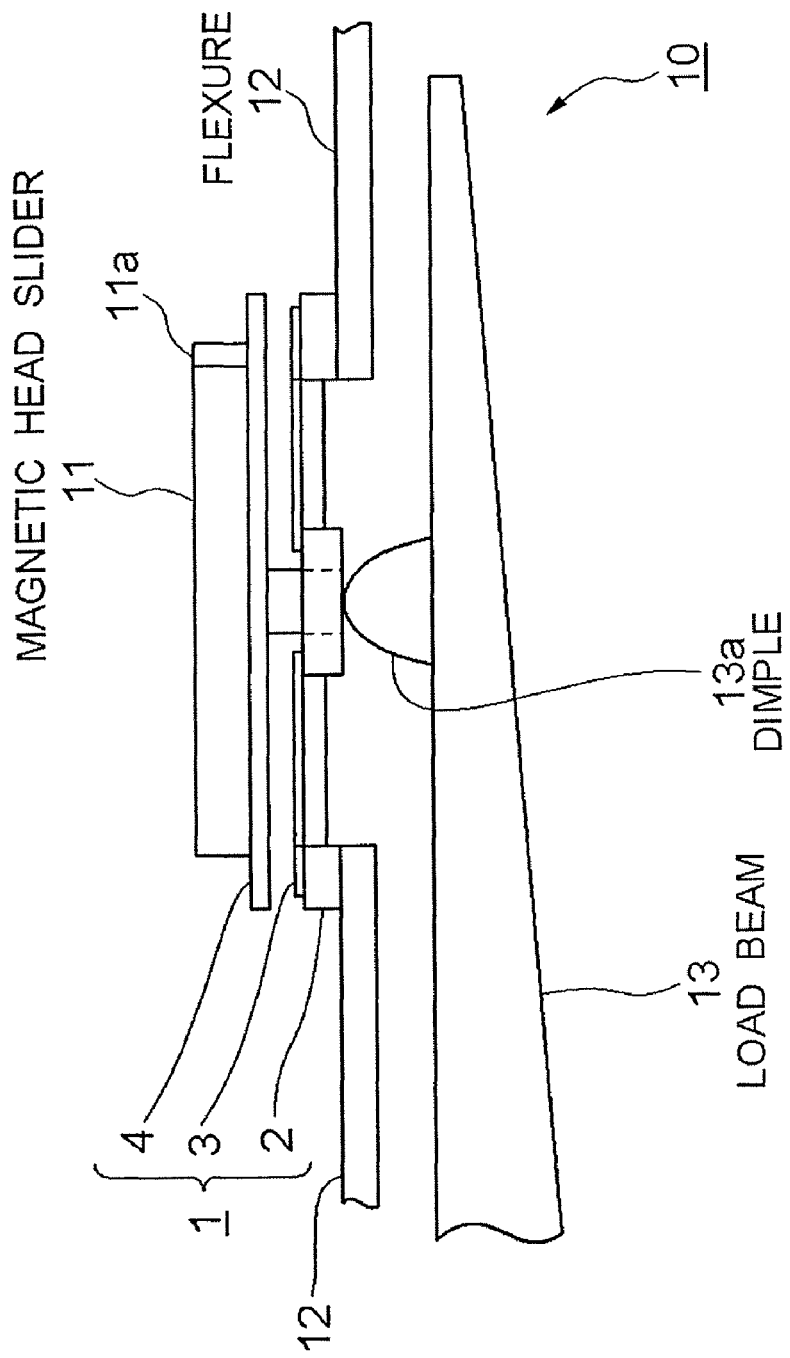
FIG. 6 is a diagram showing the tip part of a head gimbal assembly on which the microactuator is mounted.

Next, the configuration of the actuator 1 will be described in detail with reference to FIGS. 3A to 6. FIG. 3A is a plan view of the actuator body, and FIG. 3B is a side view thereof. FIG. 4A is a plan view of a stage 4 to be mounted on the actuator body, and FIG. 4B shows the side view thereof. FIG. 5 is a side view of the actuator 1 in which the stage 4 shown in FIGS. 4A and 4B is mounted on the actuator body shown in FIGS. 3A and 3B. Further, FIG. 6 is a side view in which the actuator 1 is mounted on the head gimbal assembly 10.

As shown in FIG. 3A, the actuator body which causes positioning operation of the actuator 1 consists of a frame 2 and a PZT 3 (piezoelectric device). The frame 2 is made of silicon, and as described later, the frame 2 and the PZT 3 are formed by using a material in which a thin film PZT is formed on a silicon substrate. Therefore, the frame 2 and the PZT 3 are formed integrally.

The frame 2 is formed in an almost H-shape. More specifically, the frame 2 consists of two end frames 21 and 22 in almost parallel to each other, and shaft frames 23 and 24 orthogonal to the end frames 21 and 22 and connecting to almost centers of the respective end frames 21 and 22.

Each of the end frames 21 and 22 is a rod-shaped member of prescribed length and thickness having an almost rectangle section. Of the end frames 21 and 22, one positioned on the right side in FIG. 3A is called a front end frame 21, and the other one positioned on the left side is called a back end frame 22. This is because that an end part, on which the read/write element is formed, of the magnetic head slider 11 to be mounted is set as the tip part for convenience, so the end frames 21 and 22 are called as mentioned above correspondingly.

Further, each of the shaft frames 23 and 24 is a plate-shaped member thinner than the end frames 21 and 22. The center part between them serves as a rotational center of the frame itself. In the rotational center, a shaft hole 27 is formed through which a supporting shaft 42 of the stage 4 described later penetrates. For convenience, of the shaft frames 23 and 24, one on the right side of the rotational center (shaft hole 27) in FIG. 3A, that is, one on the front end frame 21 side is called the front-side shaft frame 23, and the other one on the left side of the rotational center in FIG. 3B, that is, one on the back end frame 22 side is called a back-side shaft frame 24. Further, in the parts near the rotational center of the respective shaft frames 23 and 24, notches (dented parts) are formed inwardly such that the width becomes narrow.

Further, in a part between a pair of shaft frames 23 and 24 where the shaft hole 27 is formed, wide PZT connecting parts 24 and 25, protruding almost perpendicular to the shaft frames 23 and 24 and extending in almost parallel to the end frames 21 and 22, are formed. The PZT connecting parts 25 and 26 are formed to be thicker than the shaft frames 23 and 24, having almost same thickness as that of the end frames 21 and 22. Of the PZT connecting parts 25 and 26, one on the right side toward the front end frame 21 (lower side in FIG. 3A) is called a right PZT connecting part 25, and the other one on the left side toward the front side (upper side in FIG. 3A) is called a left PZT connecting part 26. Note that the PZT connecting parts 25 and 26 are provided for easily connecting the PZT 3 near the rotational center of the shaft frames 23 and 24, as described later.

As shown in FIG. 3B, the frame 2 is formed such that the upper surface thereof is almost flat, and the PZT 3 is formed thereon. Note that the PZT 3 is a member which deforms in an expanding or contracting manner based on a driving signal applied.

The PZT 3 consists of four separate members arranged so as to connect the end frames 21 and 22 and the PZT connecting parts 26 and 25, respectively. More specifically, a PZT 3a is provided to connect the right part toward the front side of the front end frame 21 (lower part in FIG. 3A) and the right PZT connecting part 25. Similarly, a PZT 3b is provided to connect the left part of the front end frame 21 (upper part in FIG. 3A) and the left PZT connecting part 26. Further, for the back end frame 22, PZTs 3d and 3c are provided to connect the left and right parts thereof (upper part and lower part in FIG. 3A) and PZT connecting parts 26 and 25, respectively. Thereby, the end frames 21 and 22 and the shaft frames 23 and 24 are connected via the PZT 3.

Each part of the PZT 3 is formed to be in an almost right triangular shape, and is provided such that the right angle part corresponds to a part where the end frame 21 or 22 and the shaft frame 23 or 24 crosses at right angle. In other words, each part of the PZT 3 is so provided that one of the edges defining the right angular part is connected with the end frame 21 and the other edge is positioned almost parallel to the shaft frame 23, and one top part is connected with the PZT connecting part 25 or 26. As described above, the PZT 3 is not disposed on the shaft frames 25 and 26. That is, the PZT 3 is not disposed on a line connecting the connecting parts of the shaft frames 23 and 24 and the end frames 21 and 22 and the shaft hole 27 (rotational center) (on the shaft frames 23 and 24). This configuration is for applying a torque about the rotational center to the frame 2 itself by expansion or contraction of the PZT 3 as described later.

The respective parts of the PZT 3 are disposed to contract or expand when a prescribed voltage is applied such that the end frames 21 and 22 and the PZT connecting parts 25 and 26, connected to each other, pull or push each other along the shaft frames 23 and 24.

Further, each part of the PZT 3 is provided with a terminal (not shown) to which a voltage, or a driving signal, is applied. The terminal is to be connected with trace wiring for applying a voltage formed on a device on which a microactuator is mounted.

Next, referring to FIGS. 4A and 4B, the stage 4 constituting the actuator 1 will be described. The stage 4 consists of a stage plate 41 in an almost rectangular plate-shape, and a supporting shaft 42 (shaft) in a rod-shape having a circular section fixed to the almost center of the stage plate 41. Since the stage plate 41 is disposed with the magnetic head slider 11 mounted thereon, it is formed larger than the magnetic head slider. Further, the supporting shaft 42 is formed to have an almost constant radial having a tolerance so as to be capable of penetrating the shaft hole 27 formed in the frame 2. Further, the stage plate 41 and the supporting shaft 42 are made of ceramic or prescribed metal, and further, an extendable member is preferable in order to absorb shock. Any material or forming method such as formation by half etching or formation by assembling the stage plate 41 and the supporting shaft 42 formed separately is acceptable.

As shown in FIG. 5, the stage plate 4 is configured such that the supporting shaft 42 is inserted in the shaft hole 27 of the frame 2 and fixed with an adhesive or the like filled in the insertion part. Thereby, the actuator 1 in which the actuator body and the stage 4 are integrated is formed. Although the stage 4 and the stage plate 41 are positioned on the PZT 3 mounting side of the frame 2, a prescribed gap is defined between the PZT 3 and the stage plate 41. Accordingly, operation of the PZT 3 will never be interfered by the stage as described later. Further, the supporting shaft 42 is inserted such that the end part thereof penetrates the shaft hole 27. As described later, the end part of the supporting shaft 42 contacts a device on which the microactuator is mounted so as to serve as a load receiver of the microactuator itself and as a rotational fulcrum.

FIG. 6 shows a state where the actuator 1 configured as described above is mounted on the tip part of the head gimbal assembly. In FIG. 6, the upper part is the magnetic disk side.

As shown in FIG. 6, the actuator 1 is mounted such that the lower faces of the front end frame 21 and the back end frame 22 are fixed to the flexure 12 disposed on a load beam 13 with an adhesive or the like. Note that it is mounted such that the front end frame 21 is positioned on the tip side of the head gimbal assembly 10. The end part of the supporting shaft 42 of the stage 4 inserted in the shaft hole 27 serving as the rotational center contacts the protrusion end of a dimple 13a protruding from the load beam 13 to the magnetic disk side. Note that the dimple 13a and the supporting shaft 42 are not fixed to each other, and the flexure 12 is formed of a thin plate having a spring property. Therefore, the load of the microactuator itself is supported by the dimple 13a at the end part of the supporting shaft 42, and is rotatable with reference to the dimple 13a serving as the fulcrum.

Then, as shown in FIG. 6, the magnetic head slider 11 is mounted on the stage 4 and is fixed with an adhesive or soldering. Note that the magnetic head slider 11 is arranged such that the read/write element 11a is positioned on the tip side of the head gimbal assembly 10, that is, on the front end frame 21 side of the frame 2. Further, the magnetic head slider 11 is connected by soldering with trace wiring (not shown) for transmitting read/write signals formed on the flexure 12.

In this state, the flexure 12 is formed to be separated into the body and the separated part, as shown in FIG. 6. The front end frame 21 is disposed on the separated part, and the back end frame 22 is disposed on the body. However, the body and the separated part are connected integrally by trace wiring (not shown) formed of FPC. On the separated part side, the trace wiring is provided so as to extend to the stage 4 above the separated part and is connected with the magnetic head slider 11 on the stage 4, for example. Further, from the body of the flexure 12, trace wiring is provided for applying driving voltages to the respective parts of the PZT 3 of the actuator 1, and connected to the connecting terminals on the PZT 3, for example. However, a method of connecting trace wiring is not limited to that described above. For example, it may be formed on the back side of the flexure and connected with the PZT 3 of the actuator 1.

[Operation]

Next, operation of the actuator 1 will be described with reference to FIG. 7. Note that the stage 4 is omitted in FIG. 7. Further, explanation will be given assuming that the right side of FIG. 7 is the tip side of the actuator 1, and the lower side of FIG. 7 is the right side toward the tip side of the actuator 1, same as the above description.

Figure 7:
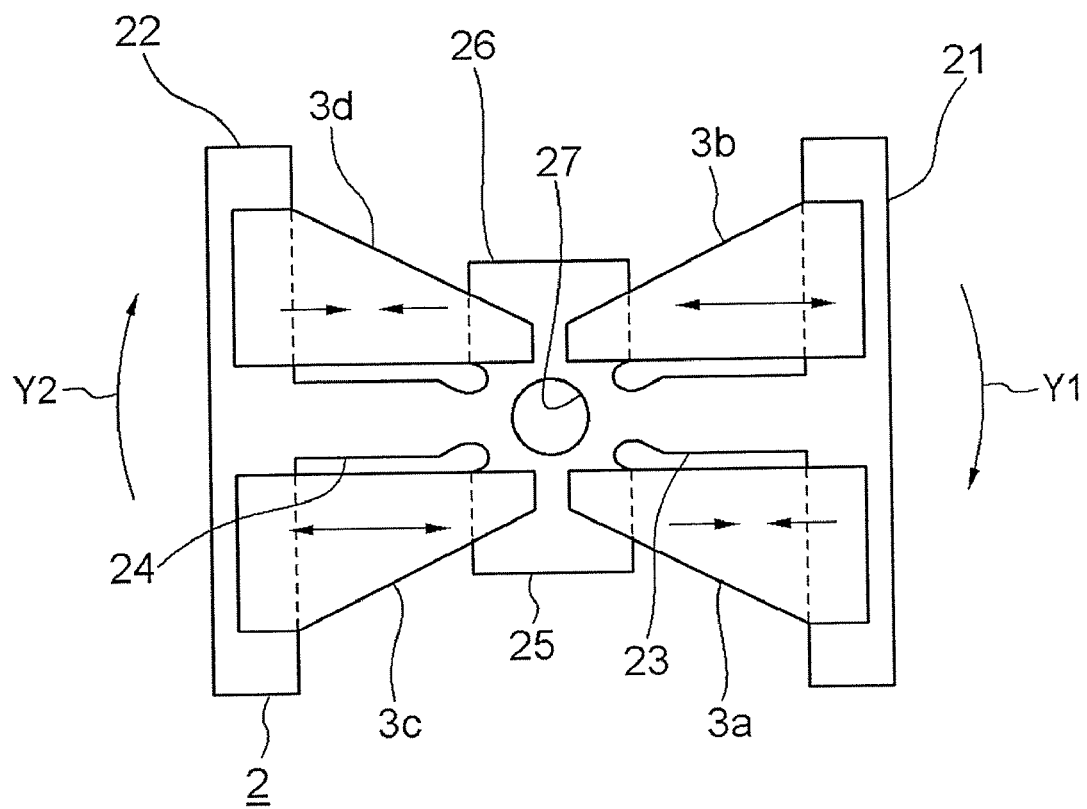
FIG. 7 is an illustration for explaining operation of the microactuator.

As shown in FIG. 7, by applying a prescribed voltage to each part of the PZT 3, each part expands or contracts. Firstly, paying attention to the PZT 3a, it contracts in a direction along the shaft frame 23 as shown by an arrow. Thereby, a force is applied to the right part of the connected front end frame in a direction pulled toward the right PZT connecting part 25. Namely, a part of the front end frame 21 is pulled toward the vicinity of the rotational center. Thereby, a torque is applied to the frame 2 itself in a direction shown by the arrow Y1 about the shaft hole 27 (supporting shaft 42).

At the same time, the PZT 3b disposed on the opposite side over the front-side shaft frame 23, connecting the left part (upper part in FIG. 7) of the front end frame 21 and the left PZT connecting part 26, expands in a direction along the shaft frame 23 as shown by an arrow. Then, a force is applied to the left part of the front end frame 21 connected thereto in a direction pushed out from the left PZT connecting part 26. Namely, a part of the front end frame 21 is pushed out from the vicinity of the rotational center. Thereby, a torque is applied to the frame 2 itself in the direction same as the arrow Y1 about the shaft hole 27 (supporting shaft 42). In other words, the PZTs 3a and 3b are arranged and driven so as to contract and expand in opposite directions over the shaft frame 23, whereby effective rotational driving can be realized.

Further, the PZTs 3c and 3d, connecting the back end frame 22 and the PZT connecting parts 25 and 26 respectively, contract and expand in opposite directions respectively, same as the above description. At this time, a voltage is applied such that the PZTs provided on the same side with the shaft frames 23 and 24 being the boundary, that is, PZTs 3a and 3c or PZTs 3b and 3d for example, contract and expand in opposite directions respectively. In other words, as shown in FIG. 7, the PZT 3c is caused to expand in a direction along the shaft frame 24, and the PZT 3d is caused to contract. Consequently, a force is applied to the right part (lower part in FIG. 7) of the connected back end frame 21 in a direction pushed out from the right PZT connecting part 25, and a force is applied to the left part (upper part in FIG. 7) of the connected back end frame 21 in a direction pulled toward the left PZT connecting part 26. Thereby, a torque about the shaft hole 27 (supporting shaft 42) in the arrow Y2 direction is applied to the frame 2 itself. As a result, Y1 and Y2 become the same rotational direction, so a torque of the same rotational direction is applied to the frame 2 efficiently.

Further, by contracting or expanding the respective PZTs 3a, 3b, 3c and 3d in directions opposite to those shown in FIG. 7, it is possible to rotate the frame 2 in directions opposite to the arrows Y1 and Y2.

According to the rotation of the frame 2 as described above, the stage 4 fixed to the shaft hole 27 rotates as well. Thereby, it is possible to rotate the position of the read/write element 11a of the magnetic head slider 11 mounted on the stage 4 about the supporting shaft 42, that is, to swing-drive it with respect to the almost center of the magnetic head slider 11 serving as the fulcrum. By forming the head gimbal assembly 10 in which the magnetic head slider 11 is mounted via the actuator 1, and forming the hard disk drive 50 by using it, it is possible to swing-drive the magnetic head slider 11 almost along the surface of a magnetic disk. In other words, it is possible to perform precise positioning of the magnetic head slider 11 by driving other than that by a voice coil motor. In particular, according to the configuration described above, it is possible to realize positioning control in a wide range with the strength of the frame 2 being high.

Although the actuator 1 is provided with four PZTs 3a, 3b, 3c and 3d in the above description, the number of the PZTs is not limited to four. A configuration including at least one PZT is acceptable. In the case of providing a plurality of PZTs, they should be arranged to expand or contract such that a torque in the same direction is applied to the frame 2.

Further, the shapes, arrangement positions and expanding/contracting directions of the PZTs 3 are not limited to those shown. Any Shape, arrangement position and expanding/contracting direction capable of applying a torque to the frame 2 by expansion/contraction are acceptable. For example, they may be arranged to expand or contract by connecting parts other than connected parts of the end frames 21 and 22 and the shaft frames 23 and 24, and the shaft hole 27 which is the rotational center or the shaft frames 23 and 24.

Further, although the actuator 1 having the stage 4 rotating integrally with the frame 2 has been described, the stage 4 is not necessarily provided. If a space for mounting the magnetic head slider 11 can be secured on the frame 2, a positioning object can be mounted on such a space.

[Manufacturing Method]

Figure 8A:
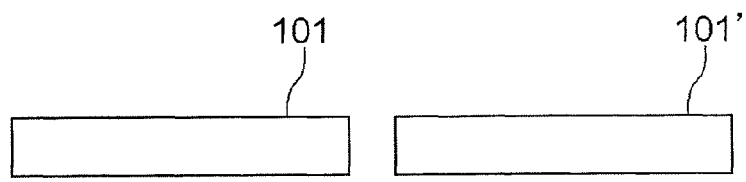
FIGS. 8A to 8D are illustrations showing a method of manufacturing the microactuator.
Figure 8B:
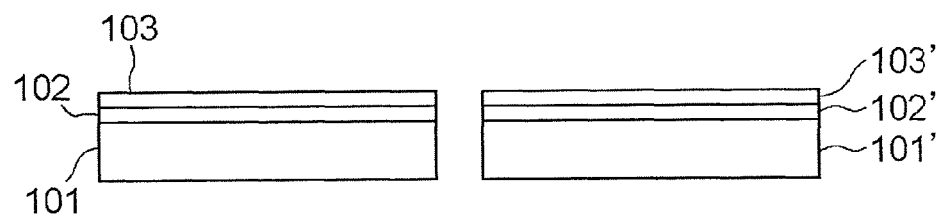
Figure 8C:
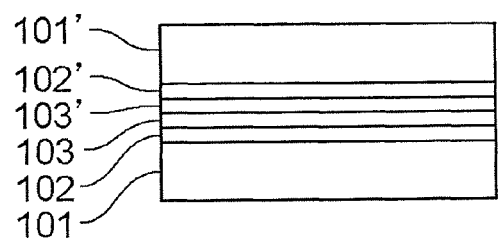
Figure 8D:
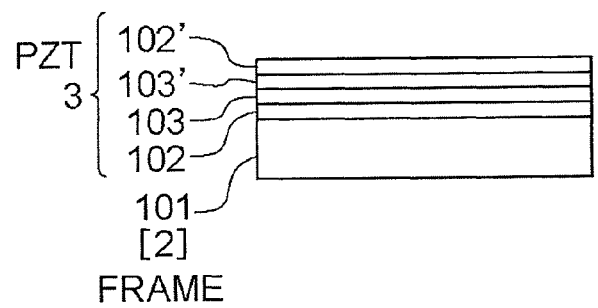

Next, method of manufacturing the actuator 1 described above will be described with reference to FIGS. 8A to 9D. Firstly, on silicon substrates 101 and 101' which are members of the frame 2 shown in FIG. 8A, electrode layers 102 and 102' and thin film PZT layers 103 and 103' are formed as shown in FIG. 8B. They are prepared in two (a pair). Then, as shown in FIG. 8C, one silicon substrate (right side silicon substrate in FIG. 8B) is turned upside down such that the PZTs 103 and 103' are adhered together. Then, as shown in FIG. 8D, the silicon substrate layer 101', on the top thereof, is removed by etching. Thereby, the silicon substrate 101 of the lowest layer becomes the frame 2 later, and the electrode layer 102, the PZT layers 103 and 103' and the electrode layer 102' laminated thereon become the PZT 3 later. Hereinafter, the silicon substrate 101 is shown as the frame 2, and the PZT layers 103 and 103' including the electrode layers 102 and 102' are shown as the PZT 3.

Figure 9A:
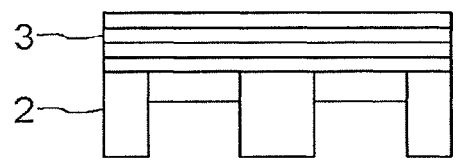
FIGS. 9A to 9D are illustrations showing the method of manufacturing the microactuator, continued from FIG. 8D.
Figure 9B:
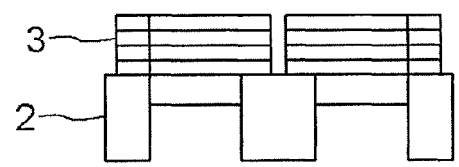
Figure 9C:
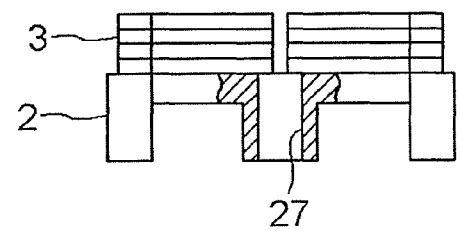
Figure 9D:
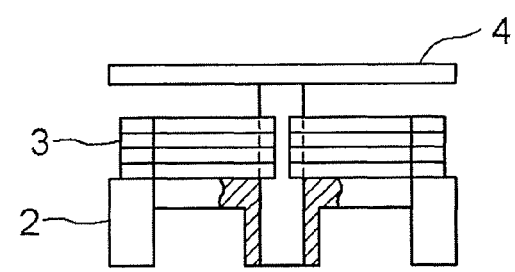

Next, as shown in FIG. 9A, the silicon substrate 101 is shaped by etching so as to be in a shape of the frame 2 (see FIG. 3A). At this time, the silicon substrate 101 is removed completely such that the part other than the part connecting with the frame 2 of the laminated PZT 3 is exposed to the laminated surface side. Then, as shown in FIG. 9B, the PZT 3 is shaped by etching into the above-described shape (see FIG. 3A), that is, four separated PZTs 3a, 3b, 3c and 3d. Further, as shown in FIG. 9C, etching is performed to form the through hole 27 in the almost center of the frame 2. Then, as shown in FIG. 9D, the supporting shaft 42 of the stage 4 is fitted in the through hole 27 and the stage 4 is fixed with an adhesive or the like, whereby the actuator 1 is manufactured.

By using a silicon substrate in which a thin film PZT has been formed on the upper surface, it is possible to form the integral structure of the frame 2 and the PZT 3. Accordingly, the manufacturing process can be simplified and the manufacturing cost can be reduced. Further, since the frame 2 and the PZT 3 are shaped by etching, it is possible to prevent mechanical stress from being involved and to shape them to be in a complex shape.

In the case where the actuator 1 is to be mounted on the head gimbal assembly 10 thereafter, the end parts of the frame 2 of the actuator 1 (front end frame 21, back end frame 11) are adhered and fixed to the flexure 12 (body, separated part). In this step, the actuator 1 is mounted such that the end part of the supporting shaft 42 of the stage 4, penetrating the shaft hole 27 and serving as the rotational center, is arranged so as to contact the protruding end of the dimple 13a of the load beam 13. Then, the magnetic head slider 11 having been mounted on the stage or mounted in this step and trace wiring provided on the flexure are connected by soldering. At the same time, the trace wiring and the connecting terminals formed on the PZT 3 are also connected by soldering. In this way, a head gimbal assembly, and further, a hard disk drive are manufactured so as to use the microactuator 1 described above for driving the magnetic head slider 11.

INDUSTRIAL APPLICABILITY

A microactuator of the present invention can be used for precisely positioning a magnetic head slider by mounting it on a head gimbal assembly (hard disk drive), so it has industrial applicability.

What is claimed is:

1. A head gimbal assembly comprising:
    a stage on which a magnetic head slider is to be mounted;
    a frame to which the stage is fixed integrally on the opposite side of the stage on which the magnetic head slider is mounted;
    a piezoelectric device disposed on the frame, which deforms in an expanding or contracting manner based on a driving signal applied; and
    a drive which applies a driving signal to the piezoelectric device, wherein
    a microactuator is provided on a tip part of a flexure in which the piezoelectric device is arranged to expand or contract to thereby apply a torque to the frame.

2. The head gimbal assembly as claimed in claim 1, wherein the piezoelectric device is arranged such that at least a part of the frame is pulled or pushed with reference to a rotational center or a vicinity thereof.

3. The head gimbal assembly as claimed in claim 2, wherein the piezoelectric device is arranged to be expandable/contractible while connecting a part of the frame excluding a part on a member running through the rotational center of the frame and on a connecting part of the member and a member connected thereto, and the rotational center or the vicinity thereof.

4. The head gimbal assembly as claimed in claim 3, wherein the frame is formed of a shaft frame running through the rotational center and one or two end frames provided on one end or both ends almost orthogonal to the shaft frame, and the piezoelectric device is arranged to expand or contract while connecting the end frame and the shaft frame.

5. The head gimbal assembly as claimed in claim 4, wherein a connecting area of the piezoelectric device protruding from the shaft frame is formed in the vicinity of the rotational center of the shaft frame.

6. The head gimbal assembly as claimed in claim 4, wherein the piezoelectric devices are provided on both sides of one end frame over a connecting part with the shaft frame such that the respective piezoelectric devices expand and contract opposite each other.

7. The head gimbal assembly as claimed in claim 6, wherein in a case where the end frames are provided on the both ends of the shaft frame, the piezoelectric devices provided on a same side with the shaft frame being a boundary are arranged so as to expand and contract opposite each other, respectively.

8. The head gimbal assembly as claimed in claim 1, wherein a shaft supporting the stage penetrates a rotational center of the frame and is fixed to the frame, and an end of the penetrating shaft serves as a load receiver of the microactuator.

9. The head gimbal assembly as claimed in claim 1, wherein the frame is a silicon substrate, and the piezoelectric device is a thin film PZT previously formed on the silicon substrate.

10. The head gimbal assembly as claimed in claim 1, wherein the microactuator is provided such that the rotational center of the frame is pivotally supported by a dimple protruding toward a magnetic disk side formed on a load beam holding the flexure.

11. The head gimbal assembly as claimed in claim 8, and the microactuator is provided such that an end part of a shaft of the stage penetrating the frame is pivotally supported by a dimple protruding toward a magnetic disk side formed on a load beam holding the flexure.

12. A hard disk drive comprising the head gimbal assembly according to claim 1.

13. A hard disk drive comprising the head gimbal assembly according to claim 11.

* * * * *